United States Patent [19]
Spitalny et al.

[11] Patent Number: 5,233,309
[45] Date of Patent: Aug. 3, 1993

[54] PROGRAMMABLE GAIN AMPLIFIER

[75] Inventors: Paul Spitalny, Allston; Martin Mallinson, Billerica, both of Mass.

[73] Assignee: Analog Devices, Inc., Norwood, Mass.

[21] Appl. No.: 819,376

[22] Filed: Jan. 9, 1992

[51] Int. Cl.$^5$ .................. H03G 3/00; H03F 3/68
[52] U.S. Cl. ...................... 330/84; 330/86; 330/144; 330/282; 330/284
[58] Field of Search ............ 330/84, 86, 144, 145, 330/282, 284

[56] References Cited

U.S. PATENT DOCUMENTS

| | | | |
|---|---|---|---|
| 3,355,670 | 11/1967 | Pastoriza | 330/9 |
| 4,354,159 | 10/1982 | Schorr et al. | 330/86 |
| 4,396,890 | 8/1983 | Kato et al. | 330/282 X |

*Primary Examiner*—James B. Mullins
*Attorney, Agent, or Firm*—Wolf, Greenfield & Sacks

[57] ABSTRACT

A programmable gain amplifier including first and second gain elements are connected by an impedance selector which allows programmability of the gain of both gain elements. The impedance selector is connected in series with the output of the first gain element. The impedance selector places an impedance in the feedback path of the first gain element or the input path of the second gain element. Errors introduced in the signal path due to the switches are attenuated by the open loop gain of the first gain element. The gain may be equally divided between both stages of the amplifier to allow for optimum band width. Optimum noise performance may be obtained by placing most of the gain in the first stage. An instrumentation amplifier may also be made which further includes a third gain element connected to the gain element with a second impedance selector in a manner similar to the connection of the first gain element to the second gain element.

14 Claims, 2 Drawing Sheets

PROGRAMMABLE GAIN AMPLIFIER

FIELD OF THE INVENTION

The present invention concerns programmable gain amplifiers. More particularly, the invention concerns programmable gain amplifiers having impedance selection networks allowing programmability.

BACKGROUND OF THE INVENTION

A conventional programmable gain amplifier (PGA) configuration is shown in FIG. 1. In such a PGA, an amplifier 10 receives an input signal at an input 11 and provides an output signal, determined by the gain of the amplifier, at its output 12. The gain of amplifier 10 is determined by the impedance in the feedback path to the feedback input 13 is determined by an impedance selector 14 located in the feedback path between the output 12 and the feedback 13. By varying the impedance in the feedback path using the impedance selector 14, the gain of the PGA may be varied. The impedance selector may be, for instance, a variable resistor, or, as is often used in integrated circuits, a switch and resistor network.

A conventional programmable gain amplifier using a switch and resistor network as the impedance selector 14 is shown in FIG. 2. In such a PGA, switches ($S_1$-$S_4$) introduce errors in the signal path, due to both thermal voltage noise and voltage errors caused by amplifier input bias currents flowing through the switches. The input bias current flowing through the switches causes voltage variations due to a changing switch resistance with respect to the common-mode voltage. This non linear resistance variation results in non linear voltages biasing the input.

One way to decrease such errors in conventional complementary metal-oxide semiconductor (CMOS) PGA's is to increase the width of the CMOS switches, thus decreasing resistance. In an integrated circuit, however, an increase in the width of a switch results in an increased die area as well as additional capacitance. For low noise circuitry, the necessary safe area size for the switch can become a significant problem.

As an alternative, a second switch may be used to offset variation in voltage caused by the first switch. This solution, however, increases both the noise caused by the switch and the die area of the integrated circuit.

Accordingly, it is an object of the present invention to provide a programmable gain amplifier that reduces errors associated with the switches.

SUMMARY OF THE INVENTION

A programmable gain amplifier in accordance with the present invention includes first and second gain elements wherein the programmability of the gain of the amplifier is distributed over both gain elements.

One embodiment of the present invention includes a first gain element having a first input, an output and at least one input for receiving a feedback signal, and a second gain element having at least one input and an output. An impedance, having two leads, is connected in series between the feedback signal input and the input of the second gain element. A switch, having two states, is connected in series with the output of the first gain element. In one state, the switch connects one lead of the impedance to the output of the first gain element. In the other state, the switch connects the other lead of the impedance to the output of the first gain element.

Another embodiment of the present invention includes a first gain element having a first input, an output, and at least one input for receiving a feedback signal, and a feedback path for feeding back a signal from the output to the feedback signal input. A second gain element has at least one input and an output. At least one switch is connected in series with the output of the first gain element and has a first state wherein an impedance is placed in the feedback path, and a second state wherein an impedance is placed in series between the output of the first gain element and the input of the second gain element.

Another embodiment in accordance with the invention includes a first gain element having a first input, an output, and at least one input for receiving a feedback signal, and a second gain element having at least a first input and an output. A plurality of series connected impedances, each having a first lead and a second lead are connected in series between the feedback signal input and the input of the second gain element. For each impedance, at least one corresponding switch is connected to receive the output of the first gain element and has a state for providing the received output to the first lead of the corresponding impedance.

In another embodiment of the present invention, there is provided a first gain element having at least a first input, an output, and at least one input for receiving a feedback signal, and a feedback path for feeding back a signal from the output to the feedback signal input. A second gain element is provided and has at least a first input and an output. An impedance selection network is connected in series with the output of the first gain element and has at least two alternate states. In a first state, a first impedance is placed in the feedback path and a second impedance is placed in series between the output of the first gain element and the input of the second gain element. In a second state, a third impedance is placed in series between the output of the first gain element and the input of the second gain element and a fourth impedance is placed in the feedback path.

A programmable gain amplifier according to the present invention, such as the embodiments above, may also be applied a differential (instrumentation amplifier) topology. Such an instrumentation amplifier is similar to a combination of two programmable gain amplifiers according to the invention which share a common second gain element which receives as its input the respective outputs of both of the first gain elements.

With a PGA in accordance with the present invention, errors due to the switches become negligible because they are attenuated by the open loop gain of the first gain element. In conventional PGA's, the open loop gain has little or no effect on such errors. Another way of looking at it is to consider the switch as an amplifier series output impedance. The resistance merely causes the first gain block to have to have slightly greater signal at its output to make up for voltage across the switch.

Another advantage of the PGA in accordance with the invention is that the two separate gain elements permit the adjustment of two gains, and two bandwidths, which can be optimized for different applications. By placing most of the gain in the first element, noise performance may be optimized. By equalizing the gain between both stages, signal handling and bandwidth may be optimized.

DETAILED DESCRIPTION

Figure 3:
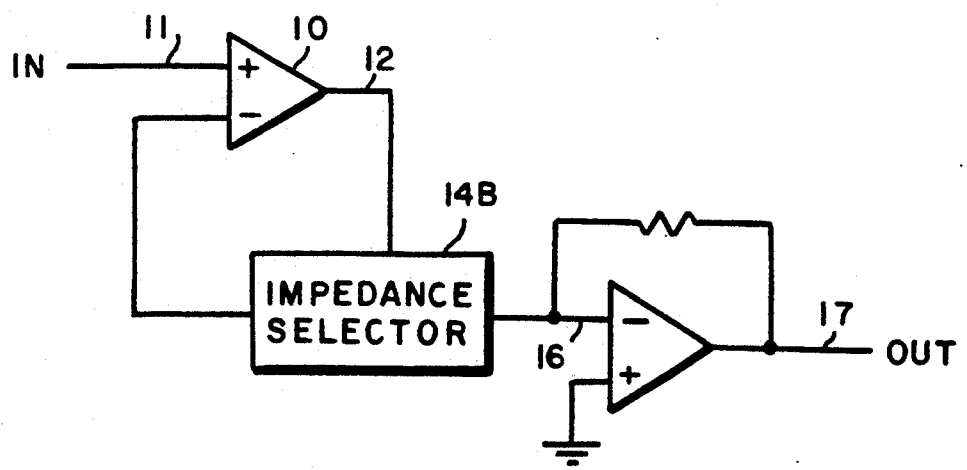
FIG. 3 is a block diagram of a programmable gain amplifier according to the present invention.

A detailed description of embodiments of the present invention will now be described in connection with FIGS. 3-5. Similar reference numbers in the drawings indicate similar structures. A block diagram of a circuit embodying the present invention is shown in FIG. 3. It includes a first gain element 10 and second gain element 15 interconnected by an impedance selector 14B. In contrast to the conventional programmable gain amplifier, the impedance selector 14B is connected in series between the output 12 of the first gain element and the input 17 of a second gain element and allows variation of the gain of both elements.

Figure 4:
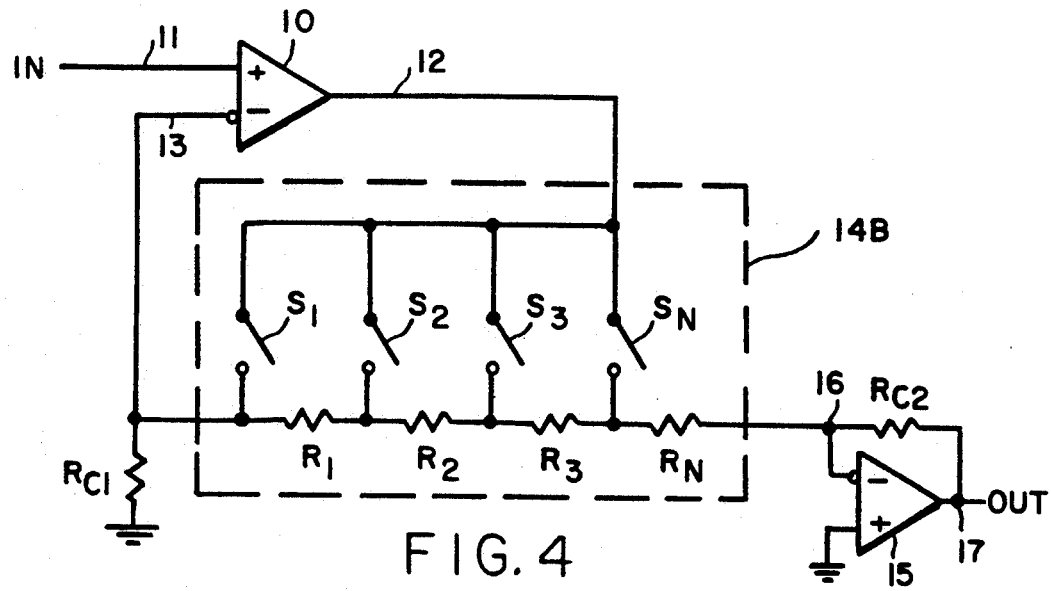
FIG. 4 is a circuit diagram of an embodiment of a programmable gain amplifier in accordance with the present invention.
Figure 5:
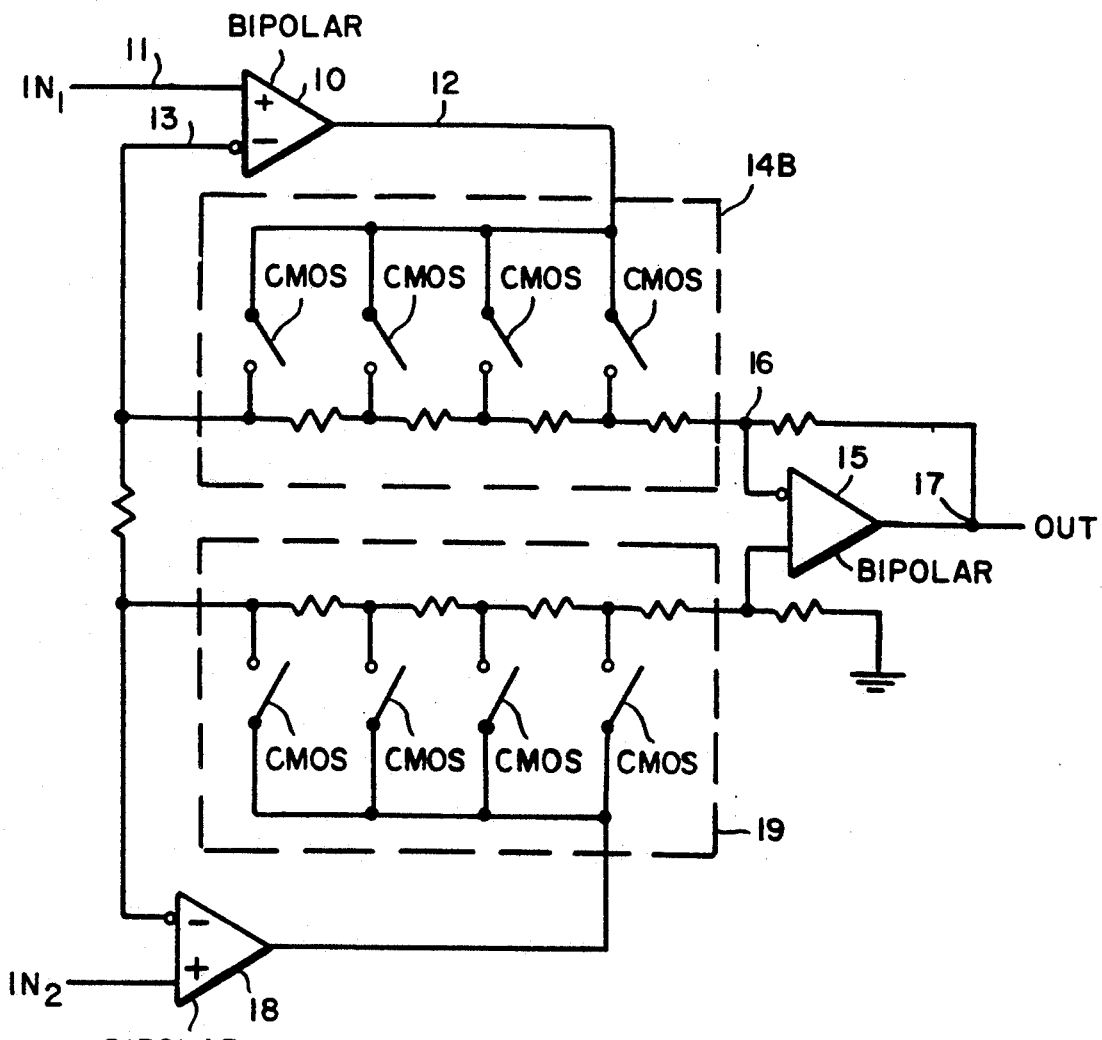
FIG. 5 is a circuit diagram of a programmable gain instrumentation amplifier in accordance with the present invention.

As an embodiment of the present invention, as shown in FIG. 4, the impedance selector 14 includes a plurality of switches ($S_1$-$S_n$) and corresponding impedances ($R_1$-$R_n$). The switches are commonly connected to receive the output 12 of the first gain element. In the embodiment shown in FIG. 4, impedances $R_1$-$R_n$ are shown as resistors for illustrative purposes. Other components providing an impedance may also be used and/or combined, such as capacitors. The PGA also includes, for the second gain element 15, a feedback resistor $R_{c2}$. Another resistor $R_{c1}$ is provided between ground and the input of gain element 10. Resistor $R_{c1}$ affects the gain of gain element 10. The invention is applicable to many other amplifier configurations and is not limited to those shown.

Figure 1:
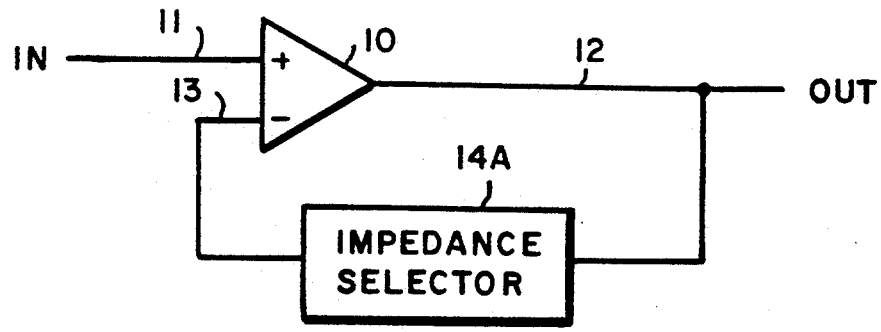
FIG. 1 is a block diagram of a conventional programmable gain amplifier.
Figure 2:
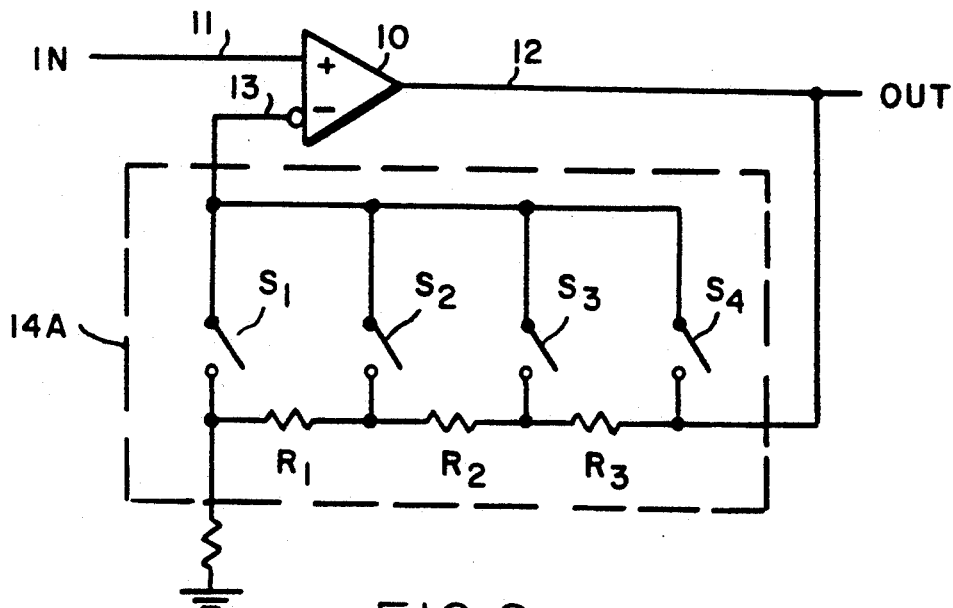
FIG. 2 is a circuit diagram of an embodiment of a conventional programmable gain amplifier.

The gain of the programmable gain amplifier in FIG. 4 depends on which switch is, or switches are, closed. For example, when switch S1 is closed, the gain of the amplifier is equal to $-R_{c2}/(R1+R2+R3+Rn)$. If the sum of the impedances R1 through Rn is equal to $R_{c2}$, then the lowest gain is unity. If switch S2 is closed, the gain of the amplifier is $(1+R1/R_{c1})$ * $-R_{c2}/(R2+R3+Rn)$. The highest gain is obtained when switch Sn is closed. In this embodiment, that gain is $(1+(R1+R2+R3)/R_{c1})$ * $R_{c2}Rn$. Given an arbitrary number N of switches S and corresponding resistors R, the gain G of the programmable amplifier of FIG. 2 when a single switch I is closed is equal to $$G_I = \left(1 + \frac{\sum_{k=0}^{I-1} R_k}{R_{c1}}\right) * \frac{R_{c2}}{\sum_{k=I}^{N} R_k}$$

In a PGA in accordance with the present invention, the gain of the amplifier is distributed between the first and second stages. In the gain equation above, the first part of the product is the gain of the first stage. The second part of the product is the gain of the second stage. If the gain is equally divided between both stages, optimum bandwidth may be obtained. When most of the gain is obtained in the first stage, optimum noise performance may be obtained. In order to configure the programmable gain amplifier so that the gain either is equally divided or is obtained primarily in the first stage, all of the gain equations for the different states of the circuit are determined. These equations are solved as a simultaneous set to satisfy the desired conditions. For example, the circuit of FIG. 4 may have most of the gain in the first stage by making $R_{c1}$ have a low impedance compared to $R_1$, $R_2$, $R_3$ and (and their sums) and $R_{c2}$ have a low impedance compared to $R_1$, $R_2$, $R_3$, $R_N$, and their sums.

An effect of placing the impedance selector 14 in series between the output of the first gain element 10, and of dividing the programmability of gain over two gain elements is that the switches are not located in the signal path. That is, the switch noise is not fed back to the input 13 of the first gain element 10, but is attenuated by the open loop gain of the first gain element. The switch noise is not fed back because the effective output of the first gain element 10, which is received by the input of the second gain element 15, is the output of the switch S. Therefore, the switch is not in the feedback path of the first gain element 10. Another result of this configuration is that there is at least one resistor in the impedance selector which plays a dual role, i.e., it is part of the feedback path of first gain element 10 in one state; it is part of the input path of the second gain element 15 in another state.

The present invention may also be applied to a differential (instrumentation amplifier) topology as shown in FIG. 3. The structure of the instrumentation amplifier is similar to the amplifier of FIG. 2 but also includes a third gain element 18 connected to the second gain element 15 via an impedance selector 19 in a manner similar to the connection of gain element 10 to gain element 15. The gain equations of this structure are generally the same as those described above.

The programmable gain amplifier of the present invention is applicable to circuits having at least two cascaded gain elements. With the present invention, each gain element has a gain which is programmable by an impedance selector. A PGA in accordance with the present invention may be implemented using discrete components, such as on a printed circuit board, or in an integrated circuit, or even with vacuum tubes. It may also be implemented as a BiMOS integrated circuit in which the amplifiers are bipolar and the switches are CMOS.

Having now described a few embodiments of the invention, it should be apparent to those skilled in the art that the foregoing is illustrative only in not limiting, having been presented by way of example only. Numerous other embodiments and modifications thereof are contemplated as falling within the scope of the present invention as defined by the appended claims and equivalents thereto.

What is claimed is:

1. A programmable gain amplifier comprising:
   a first gain element having means for receiving an input, means for providing an output, and means for receiving a feedback signal;
   a second gain element having means for receiving an input and means for providing an output;

an impedance having a first lead connected to the feedback signal receiving means and a second lead connected to the input receiving means of the second gain element;
a switch connected to the output of the first gain element having a first state for connecting the output of the first gain element to the first lead of the impedance and having a second state for connecting the output of the first gain element to the second lead of the impedance;
said first gain element being capable of receiving a continuous AC input signal as its input;
said second gain element providing, as its output, a continuous AC signal which is a function of the input signal, and wherein the second gain element has means for receiving a second input,
a third gain element having means for receiving an input, means for providing an output, and means for receiving a feedback signal;
a second impedance having a first lead connected to the feedback signal receiving means of the third gain element and a second lead connected to the second input receiving means of the second gain element; and
a second switch connected to the output of the third gain element having a first level for connecting the output of the third gain element to the first lead of the second impedance and having a second state for connecting the output of the third gain element to the second lead of the second impedance.

2. The programmable gain amplifier of claim 1 wherein said gain elements, said impedance and said switch are imbedded in an integrated circuit.

3. The programmable gain amplifier of claim 2, wherein said gain elements are bipolar amplifiers and said switch is a CMOS switch.

4. A programmable gain amplifier comprising:
a first gain element having means for receiving an input, means for providing an output, and means for receiving a feedback signal;
a second gain element having means for receiving an input and means for providing an output;
an impedance;
a switch having a first terminal connected to the output of the first gain element and a second terminal;
a feedback path for feeding back a signal from the second terminal of the switch to the feedback signal receiving means;
said switch having a first state wherein the impedance is placed in the feedback path, and a second state wherein the impedance is placed in series between the second terminal of the switch and the input receiving means of the second gain element;
said first gain element being capable of receiving a continuous AC input signal as its input; and
said second gain element providing, as its output, a continuous AC signal which is a function of the input signal.

5. A programmable gain amplifier as set forth in claim 4, wherein the second gain element has means for receiving a second input, the amplifier further comprising:
a third gain element having means for receiving an input, means for providing an output, and means for receiving a feedback signal;
a feedback path for the third gain element for feeding back a signal from said output to said feedback receiving means;
a second impedance;
at least one switch connected in series with the output of the third gain element and having a first state wherein the second impedance is placed in the feedback path for the third gain element, and a second state wherein the second impedance is placed in series between the output of the third gain element and the second input receiving means of the second gain element.

6. The programmable gain amplifier of claim 5 wherein said gain elements, said impedance and said switch are imbedded in an integrated circuit.

7. The programmable gain amplifier of claim 6 wherein said gain elements are bipolar amplifiers and said switch is a CMOS switch.

8. A programmable gain amplifier comprising:
a first gain element having means for receiving an input, means for providing an output, and means for receiving a feedback signal;
a second gain element having means for receiving an input and means for providing an output;
a plurality of series connected impedances, each having a first lead and a second lead, said series plurality of impedances being connected in series between the feedback signal receiving means and the input receiving means of the second gain element;
for each impedance, at least one corresponding switch connected to the output of the first gain element and having means for receiving the output of the first gain element and having a state for providing the received output to the first lead of the corresponding impedance;
said first gain element being capable of receiving a continuous AC input signal as its input;
said second gain element providing, as its output, a continuous AC signal which is a function of the input signal, and wherein the second gain element has means for receiving a second input,
a third gain element having means for receiving an input, means for providing an output, and means for receiving a feedback signal;
a second plurality of series connected impedances, each having a first lead and a second lead, said plurality of series connected impedance being connected in series between the feedback signal receiving means of the third gain element; and
for each impedance in said second plurality of series connected impedances, at least one corresponding switch connected to the output of the third gain element and having means for receiving the output of the third gain element and having a state for providing the received output to the first lead of the corresponding impedance.

9. The programmable gain amplifier of claim 8 wherein said gain elements, said impedance and said switch are embedded in an integrated circuit.

10. The programmable gain amplifier of claim 9 wherein said gain elements are bipolar amplifiers and said switch is a CMOS switch.

11. A programmable gain amplifier comprising:
a first gain element having means for receiving an input, means for providing an output, and means for receiving a feedback signal;
a feedback path for feeding back a signal from said output to said feedback signal receiving means;

a second gain element having means for receiving an input and means for providing an output;

an impedance selection network connected in series with the output of the first gain element and having at least two alternate states defined by switches connected directly to the output of the first gain element, the states including a first state wherein a first impedance is placed in the feedback path and a second impedance is placed in series between the output of the first gain element and the input receiving means of the second gain element, and a second state wherein a third impedance is placed in series between the output of the first gain element and the input receiving means of the second gain element and a fourth impedance is placed in the feedback path;

said first gain element being capable of receiving a continuous AC input signal as its input;

said second gain element providing, as its output, a continuous AC signal which is a function of the input signal, and wherein the second gain element has means for receiving a second input, a third gain element having means for receiving an input, means for providing an output, and means for receiving a feedback signal;

a feedback path for the third gain element, for feeding back a signal from said output to said feedback signal receiving means;

a second impedance selection network connected in series with the output of the third gain element and having at least two alternate states defined by switches directly connected to the output of the third gain element, the states including a path of the third gain element and a second impedance is placed in series between output of the third gain element and the second input receiving means of the second gain element, and a second state wherein a third impedance is placed in series between the output of the third gain element and the second input receiving means of the second gain element and a fourth impedance is placed in the feedback path of the third gain element.

12. The programmable gain amplifier of claim 11 wherein said gain elements, said impedance and said switch are imbedded in an integrated circuit.

13. The programmable gain amplifier of claim 12 wherein said gain elements are bipolar amplifiers and said switch is a CMOS switch.

14. A programmable gain amplifier, comprising:

a first differential amplifier having an input, an output and means for receiving a feedback signal, a second differential amplifier having first and second input and, an output;

a first plurality of switches, each having a first terminal and a second terminal connected to the output of the first differential amplifier;

a first plurality of impedances including an impedance, provided for each switch, each impedance having a terminal connected to the first terminal of the corresponding switch;

said first plurality of impedances being interconnected to form an impedance having a first terminal connected to the feedback signal receiving means of the first differential amplifier and a second terminal connected to the first input of the second differential amplifier;

said first differential amplifier being capable of receiving a continuous AC input signal at its input;

a third differential amplifier having an input and output and means for receiving a feedback signal; a second plurality of switches, each having a first terminal and a second terminal connected to the output of the third differential amplifier;

a second plurality of impedances including an impedance provided for each switch in the second plurality of switches, each impedance having a terminal connected to the first terminal of a corresponding switch, said second plurality of impedances being interconnected to form an impedance having a first terminal connected to the feedback signal receiving means of the third differential amplifier and a second terminal connected to the second input of the second differential amplifier; and said third differential amplifier being capable of receiving a continuous AC input signal at its input and said second differential amplifier providing an output signal which is a function of the continuous AC input signals received by said first and third differential amplifiers.

* * * * *